United States Patent
Wrycraft et al.

(10) Patent No.: US 6,947,281 B2
(45) Date of Patent: Sep. 20, 2005

(54) COOLING UNITS

(75) Inventors: Sean Conor Wrycraft, Harrow (GB); Paul Garnett, Camberley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 105 days.

(21) Appl. No.: 10/370,126

(22) Filed: Feb. 18, 2003

(65) Prior Publication Data

US 2003/0161103 A1 Aug. 28, 2003

(30) Foreign Application Priority Data

Feb. 28, 2002 (GB) .............................................. 0204770

(51) Int. Cl.[7] .................................................. H05K 7/20
(52) U.S. Cl. ...................... 361/695; 165/80.3; 165/121; 451/184; 415/213.1; 439/485; 439/378
(58) Field of Search ...................... 165/80.3, 121–122; 361/687, 694–695, 715; 415/175–177, 206, 213.1, 214.1, 215.1; 417/360, 423.15, 423.5; 454/186; 439/485, 378

(56) References Cited

U.S. PATENT DOCUMENTS

| | | | | |
|---|---|---|---|---|
| 4,939,624 | A | * | 7/1990 | August et al. ............... 361/816 |
| 5,562,410 | A | * | 10/1996 | Sachs et al. ............. 415/213.1 |
| 5,788,467 | A | | 8/1998 | Zenitani et al. |
| 6,075,698 | A | | 6/2000 | Hogan et al. |
| 6,147,865 | A | | 11/2000 | Sasaki et al. |
| 6,392,872 | B1 | | 5/2002 | Doustou, III et al. |
| 6,406,257 | B1 | * | 6/2002 | Houdek .................... 415/213.1 |
| 6,493,225 | B2 | | 12/2002 | Chuang et al. |
| 6,522,537 | B2 | | 2/2003 | Chen |
| 2001/0024358 | A1 | | 9/2001 | Bonet |

FOREIGN PATENT DOCUMENTS

| | | |
|---|---|---|
| DE | 19808352 | 9/1999 |
| DE | 201 04 038 U1 | 3/2001 |
| DE | 19940588 | 4/2001 |
| EP | 1 201 930 A2 | 10/2001 |
| JP | 2-266597 | 10/1990 |
| JP | 7-176882 | 7/1995 |
| JP | 8-148614 | 6/1996 |
| JP | 8-338676 | 12/1996 |
| JP | 10-294581 | 11/1998 |
| JP | P2000-244160 A | 9/2000 |

OTHER PUBLICATIONS

Examination Report, GB0204770.2, mailed Jan. 7, 2005.

* cited by examiner

*Primary Examiner*—Gregory Thompson
(74) *Attorney, Agent, or Firm*—Meyertons Hood Kivlin Kowert & Goetzel, P.C.; B. Noël Kivlin

(57) ABSTRACT

An electrically powered cooling unit (130), such as a fan unit, is mountable on a support structure (110) within a housing (140), for example a computer housing. The support structure (110) can mount one or more electrically powered cooling units (130). Each cooling unit (130) includes an electrical connector (400) fixed relative to the cooling unit and cooperable with a connector of the support structure, so that offering the cooling unit up to its mounting position completes the electrical connections between the cooling unit and the support structure. In alternative embodiments, a single structure is used both to physically support and electrically connect the cooling unit (130) to the support structure (110).

21 Claims, 13 Drawing Sheets

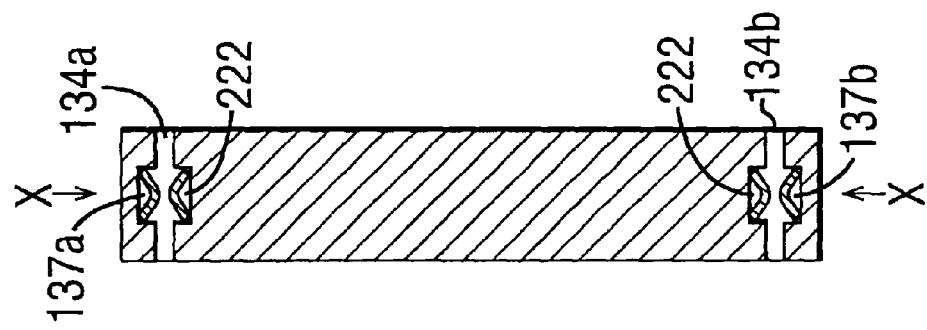
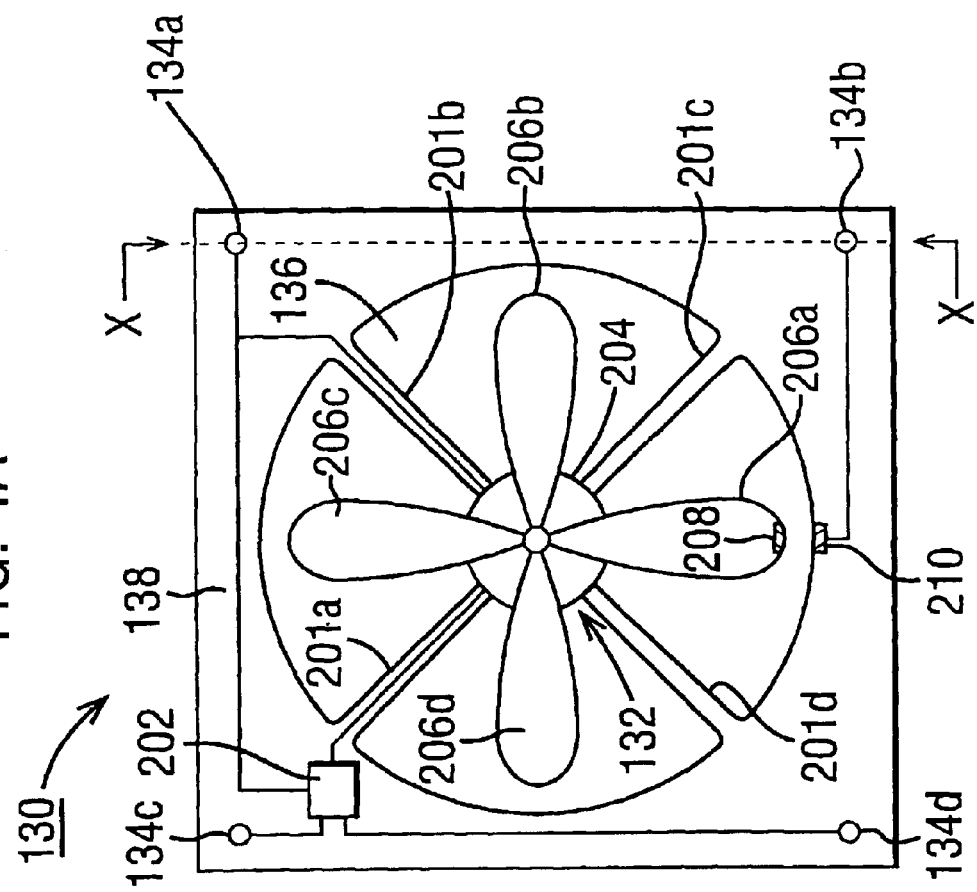

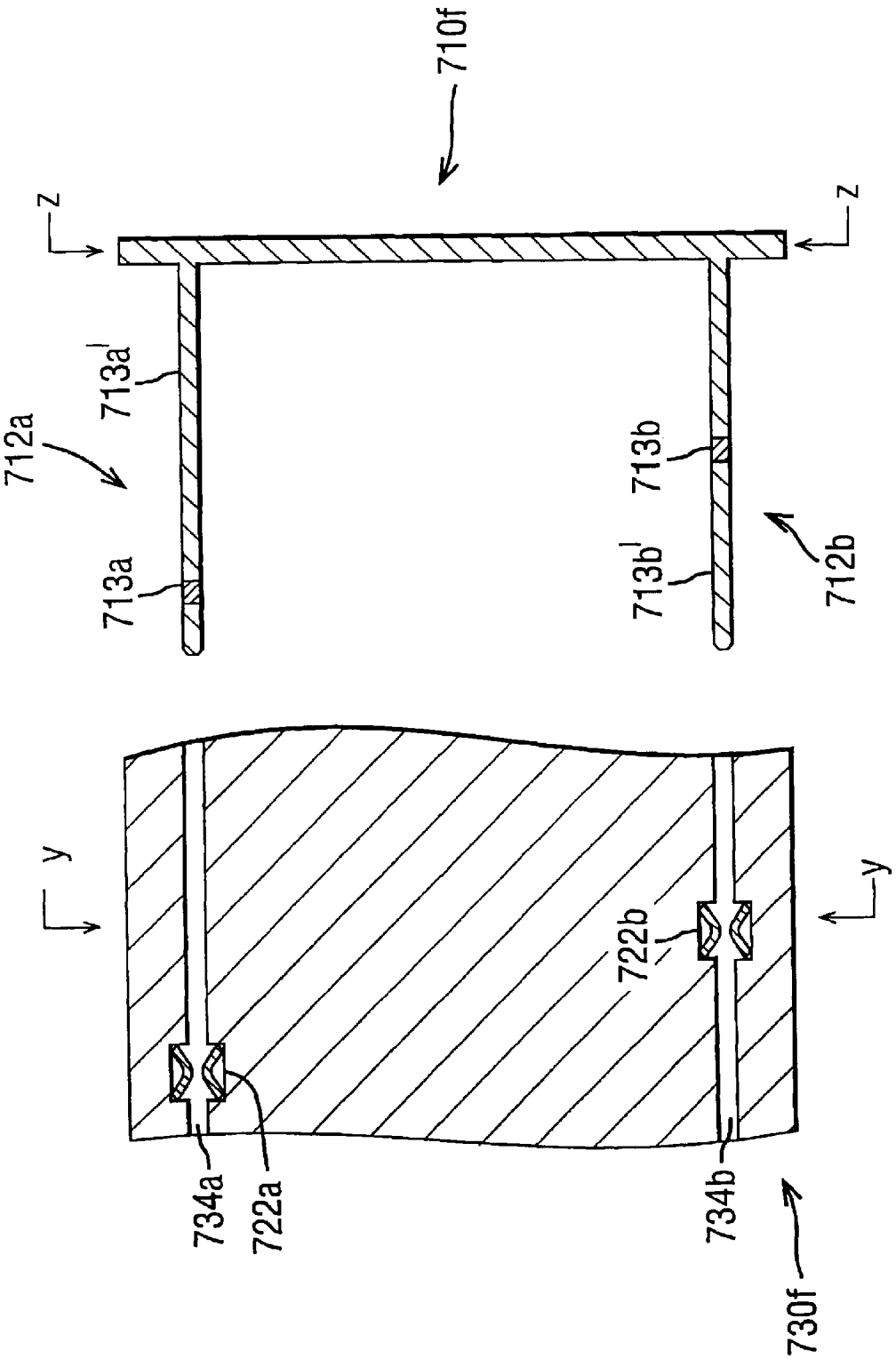

COOLING UNITS

BACKGROUND OF THE INVENTION

The present invention relates to cooling units. Illustrative embodiments relate to, but not exclusively to, cooling units for use with computer systems.

Electronic circuitry, and particularly processor circuitry, is susceptible to performance deterioration if it is allowed to operate outside of an ideal temperature range. In some circumstances electronic circuits can even fail due to an excess of heat.

To reduce the likelihood of electronic circuitry overheating, it is possible to provide forced cooling by using cooling units. For example, a computer system can comprise electronic circuitry housed within a casing. Typically, the casing includes at least one vent or aperture that can be located towards the rear of the casing, adjacent to which a cooling unit, for example a fan unit, is mounted. Fans are operated to drive warmed air heated by the encased electronic circuitry out of the casing, through the vent(s) or aperture(s) and then to the surrounding environment. The casing will also typically incorporate air intake slots through which cooler air can initially enter the casing. The fans can incorporate mechanisms for controlling the rotational speed of the fan blades and/or a tachometric output for sensing the actual blade rotation speed. These control and sensing inputs can be used in a feedback arrangement to vary the fan speed depending upon the power consumption of the electronic circuitry. Generally, the fans are connected to a power supply by way of flexible wires coupled to a block connector plug. A co-operating block connector socket can be formed on a computer motherboard and can provide both power connections and additional connections for feedback control.

Although the use of fans is a fairly inexpensive way to provide forced cooling, conventional fans do suffer from drawbacks. A conventional fan typically includes "a flying lead" with electrical connectors at the free end for making electrical connections for power and/or electrical signals to the fan. These wire connectors (such as block connectors) are susceptible to damage as connection and/or disconnection to a mating connector on a circuit board is effected. The contacts can become bent and/or the wires become loose or break internally, thereby either breaking contact completely or causing intermittent electrical contact. This can affect the reliability of the cooling system and lead to the types of problem associated with overheating as mentioned above. Also, when a fan unit is replaced, it is necessary to obtain a fan unit with wires of an appropriate length to avoid difficulties in making the electrical connections.

Furthermore, the operation to replace a faulty fan unit of the "flying lead" type requires first an operation to fix the fan to the casing, and secondly an operation to locate the appropriate power supply connection and connect the electrical connector of the fan thereto. This two-stage process is time consuming for the maintenance operative, and cannot be entrusted to an unskilled operator.

SUMMARY OF THE INVENTION

One aspect of the invention provides a device and method for facilitating the mounting of a fan unit with a flying lead electrical connection. The device comprises a mounting element for a fan unit having a housing, an electrical lead extending from the housing, and an electrical connector element at the free end of the lead. The mounting element has a fixing formation for securing it to the fan housing and a holder for receiving the electrical connector to present the connector in a predetermined position relative to the fan housing. The cooperating electrical supply connection is then positioned relative to the fan mounting position in the casing so that electrical connection is effected as the fan housing is offered up to its mounting position, to be secured therein by fastener elements. The fixing of the electrical connector relative to the fan housing thus makes mounting the fan unit a single-stage operation, saving operator time by eliminating the second, electrical connection step.

The present invention provides, in another aspect, a fan assembly comprising a fan unit having a housing, an electrical lead and a connector at a free end of the lead, and a mounting element attached to the fan housing and having a holder in which the connector is located to fix the connector relative to the fan housing.

A further aspect of the invention provides a method of replacing a fan unit wherein fasteners securing the fan unit to the casing of a computer system are removed, and the fan unit is removed from its mounting position with simultaneous disengagement of electrical connectors between the computer system and the fan unit, a replacement fan unit is placed in a mounting position with simultaneous engagement of electrical connectors between the fan unit and the computer system, and fasteners are applied to fix the replacement fan unit in position. To further streamline the replacement procedure, the fasteners which secure the fan unit in position may provide the electrical connection between the fan unit and the remainder of the computer system.

A further aspect of the present invention provides an electrically powered cooling unit comprising at least one connector formation. Each such connector formation is configured to establish an electrical connection for the cooling unit by engagement with a mutually co-operating connector formation of a support structure. The engagement of the connector formation with the co-operating connector formation is further operable to mount the cooling unit on the support structure.

In this manner an electrically powered cooling unit can be both electrically connected through and mechanically supported by one or more connector formations. Electrical connections can be provided for the supply of power and/or for signal and/or sensing connections to the cooling unit.

The electrically powered cooling unit can be hot-swappable so that it can be connected and disconnected without powering down the connections. This allows electrically powered cooling units to be added and replaced and is useful if any such units fail and need to be replaced. The electrically powered cooling unit can be in the form of an electrically powered fan, such as a rotary fan.

A connector formation on the cooling unit that connects to the support can be in the form of a male or a female connector member. It can, for example, comprise a resiliently biassed contact. The connector formation or formations can be keyed in some manner, e.g., they can be non-symmetrical in layout or in cross-section to help prevent the electrically powered cooling unit from being incorrectly connected.

Additional connectors can be provided for mechanical support. These connectors can also provide electrical connections. The connector formations can be arranged for keying so that so that the electrically powered cooling unit can be connected to the support structure only in a single orientation. The connector formation and/or the connectors can have electrical connection points formed at different positions in their structure to provide depth keying of electrical connections that help reduce problems associated with misconnection of the electrically powered cooling unit when connected to a support structure. The depth keying may provide for sequential electrical connection as the cooling unit is mounted.

Another aspect of the invention provides a cooling unit assembly comprising an electrically powered cooling unit having a connector formation mechanically mounted and electrically connected to a mutually co-operating connector formation of a support structure. The cooling unit assembly reduces the need for trailing wires, and can thus improve the reliability of any system in which the cooling unit assembly is installed. This arrangement can also lessen the amount of wiring and thereby improve the airflow and the ease of any assembly/maintenance of systems in which the cooling unit assembly is incorporated.

Another aspect of the invention provides a support structure for receiving at least one cooling unit that includes a connector formation. The support structure includes a co-operating connector formation that is configured to establish an electrical connection for the cooling unit by engagement with the connector formation of the cooling unit. The engagement of the connector formation with the co-operating connector formation may be further operable to mount the cooling unit on the support structure.

The electrically powered cooling units can be connected to power supply potentials and/or one or more signal lines formed in or on the support structure. The power and/or signal(s) can be provided through one or more of the connectors. The signal(s) can be a tachograph control signal and/or a speed measurement signal for a fan. Where both types of signal are used, feedback control can be used to regulate the speed of the fan according to the heat removal requirement (either estimated, measured or predetermined). Any electrical connection(s), such as those for supplying power, forming signal lines, etc. can pass through the support structure to a further connector. Such a further connector can be used to electrically connect the support structure to a computer motherboard.

A further aspect of the invention provides a computer system housing including a support structure that has a connector formation configured to mechanically mount and electrically connect to a mutually co-operating connector formation of an electrically powered cooling unit. The support can comprise a plurality of connector formations for mounting to at least one additional cooling unit. More than one electrically powered cooling unit can be mounted in a single computer system housing using one or more support structures. An aperture can be formed in the support structure(s) and the casing through which waste heat can be expelled to the environment external to the housing. This aperture can be covered by a grill or formed from a plurality of openings to help reduce the likelihood of objects entering the cooling unit(s). Cooling unit assemblies or their support structures can be retrofitted to existing casings. The computer system housing can comprise one or more such cooling unit assemblies.

Other aspects of the invention provide a support structure for a computer system housing, and a computer system that includes such a computer system housing.

A further aspect of the invention provides a method of replacing a cooling unit in such a computer system. The method includes steps of removing a first cooling unit and then mounting a second cooling unit. Removing a first cooling unit includes disengaging each connector formation on the first cooling unit from each mutually co-operating connector formation of a support structure, disengagement of the connector formation(s) from the co-operating connector formation(s) electrically disconnecting and mechanically releasing the first cooling unit from the support structure. Mounting a second cooling unit includes engaging each connector formation on the second cooling unit with each mutually co-operating connector formation of the support structure, engagement of the connector formation(s) with the co-operating connector formation(s) electrically connecting and mechanically mounting the second cooling unit on the support structure.

BRIEF DESCRIPTION OF THE DRAWINGS

Embodiments of the present invention will now be described, by way of example only, with reference to the accompanying drawings wherein like numerals refer to like parts and in which:

FIG. 4A shows an electrically powered cooling unit forming part of the cooling unit assembly shown in FIG. 3;

FIG. 4B shows a sectional view taken along the line X—X through the electrically powered cooling unit of FIG. 4A;

FIG. 9G shows a sectional view along the line Y—Y of the electrically powered cooling unit of FIG. 9F and a sectional view along the line Z—Z of the support structure of FIG. 9F;

DESCRIPTION OF PARTICULAR EMBODIMENTS

Figure 1:
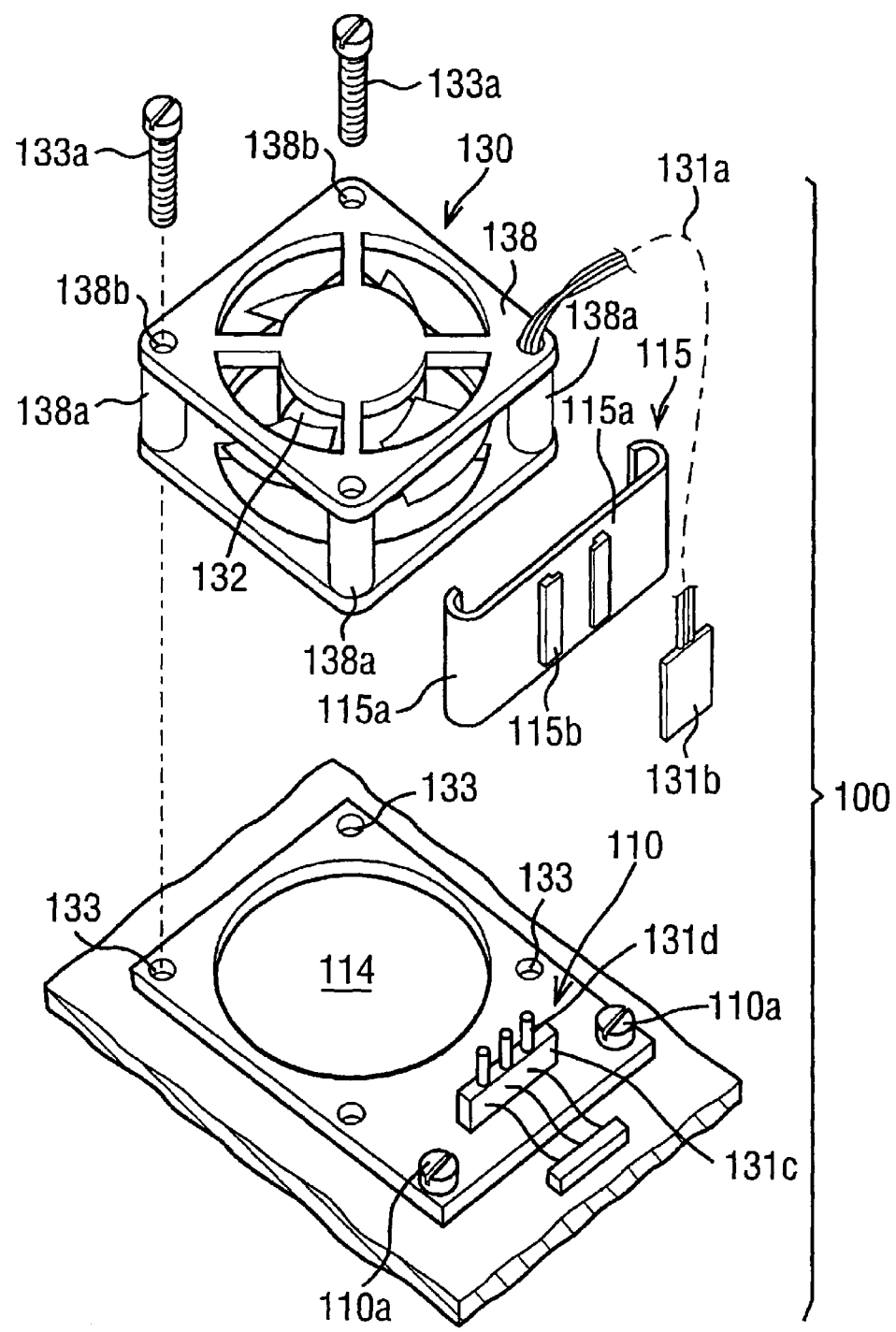
FIG. 1 is an exploded perspective view of a first embodiment of the invention.

Referring now to FIG. 1, there is shown a cooling unit assembly 100 of a first embodiment of the invention. The cooling unit assembly 100 comprises an electrically powered cooling unit 130 comprising an axial flow fan 132 mounted in a housing 138. Electrical power is supplied to the fan by a flying lead 131a terminating in a connection socket 131b. The cooling unit 130 is mounted to a computer casing 140 by means of a support structure 110. The support structure 110 has an opening 114 through which air is caused to pass by the fan 132 when in operation. The support structure 110 further comprises a connection plug 131c having pins 131d to connect to the connection socket 131b of the cooling unit 130.

In order to provide a fixed relationship between the housing 138 of the cooling unit 130 and the socket 131b, a mounting clip 115 is provided. The mounting clip 115 is formed from a strip of resilient material curved at its ends to form part-cylindrical grip portions 115a which are engageable with corner pillars 138a of the housing 138 of the cooling unit 130. On a central part of the clip 115 is a resilient grip structure formed from two undercut ridges 115b, between which the socket 131b of the cooling unit 130 is locatable.

The corner pillars 138a of the cooling unit housing 138 have axial bores 138b, through which threaded fasteners 133a may be passed. The support structure 110 has threaded bores 133 arranged to correspond with the bores 138b of the corner pillars 138a. The support structure 110 is mounted to the computer casing 140 by, for example, threaded fasteners 110a.

The cooling unit 130 is first assembled by snap-engaging the clip 115 to two of the corner pillars 138a of the cooling unit 130, and then inserting the connecting socket 131b of the cooling unit 130 into the mounting structure 115b of the clip 115.

This pre-assembled unit is then offered up to the support structure 110 by aligning the bores 138b of the pillars 138a with the threaded openings 133. The positioning of the connection plug 131c is such that, when this alignment is performed, the pins 131d of the connection plug 131c will enter receiving openings in the connection socket 131b as it is held in the supporting structure 115b of the clip 115. The mechanical fixing of the fan unit 130 to the support structure 110 is by means of threaded fasteners 113a passing through the bores 138b in the corner pillars 138a and engaging the threaded openings 133 of the support structure 110.

By pre-assembling the fan unit 130 and clip 115, and locating the socket 131b in the receiving structure 115b of the clip 115, the operation of mounting the cooling unit 130 is made a single-stage operation, removing the need for a two-stage operation involving first mechanically mounting the cooling unit 130 and subsequently making the connection between the connecting socket 131b and the connection plug 131c. This saving of operator time in the mounting operation is achieved at minimum expense by using a standard cooling unit 130 with flying lead modified by the addition of an inexpensive mounting clip 115 and a corresponding support structure 110.

Figure 2:
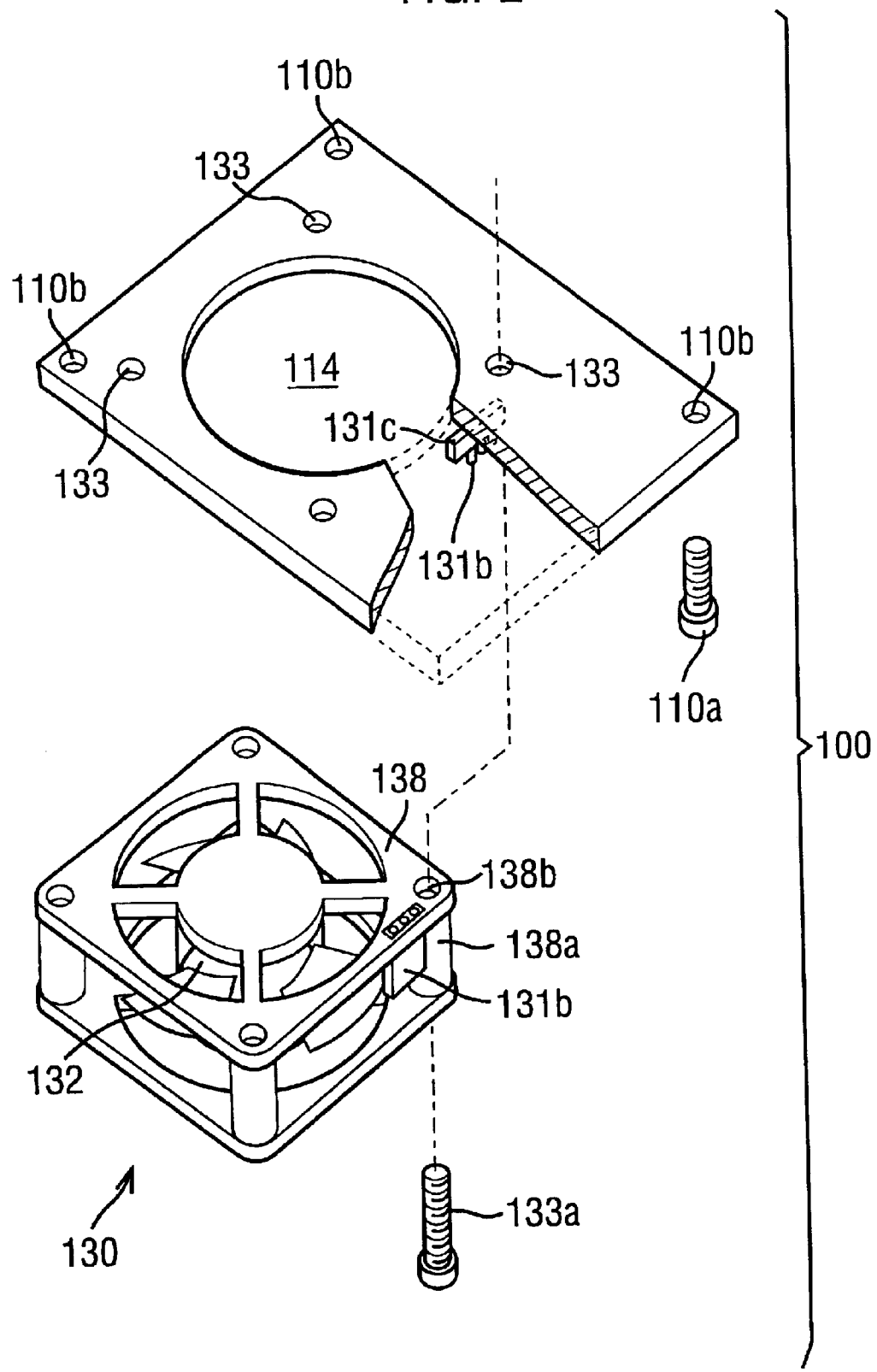
FIG. 2 is an exploded perspective view of a second embodiment of the invention.

FIG. 2 is an exploded perspective view of a second embodiment of the invention, showing a cooling unit assembly 100 comprising a cooling unit 130 and a support structure 110.

The support structure 110 is similar to that shown in FIG. 1, in that it comprises a plate 110 with an aperture 114 through which air is caused to flow by the cooling unit 130. Threaded openings 133 are positioned to correspond with bores 138b in corner pillars 138a of the cooling unit 130, and a connection plug 131c with connecting pins 131d is mounted to the support structure 110 to provide electrical connection to the cooling unit. The support structure 110 is mountable to a computer casing (not shown) by threaded fasteners 110a passing through clearance holes 110b in the support structure 110.

The cooling unit 130 of FIG. 2 is similar to that shown in FIG. 1, except that the electrical connection socket 131b is mounted to the housing 138 of the cooling unit directly, rather than being attached thereto by a flying lead.

Mounting of the cooling unit 130 to the support structure 110 is effected in the same way as described in relation to the embodiment of FIG. 1. Since the connection socket 131b is fixed to the housing 138 of the cooling unit 130, and the connection plug 131c is positioned in a corresponding location on the support structure 110, the offering up of the cooling unit 130 to its mounting position will make the electrical connections between the support structure 110 and the cooling unit 130. The operator then secures the cooling unit 130 in position by means of threaded fasteners 133a passing through bores 138b in the corner pillars 138a of the cooling unit 130 and engaging threaded openings 133 in the support structure 110.

In order further to streamline the mounting and dismounting operation, embodiments of the invention have been developed in which the use of threaded fasteners 133a is avoided. Such embodiments will now be described.

Figure 3:
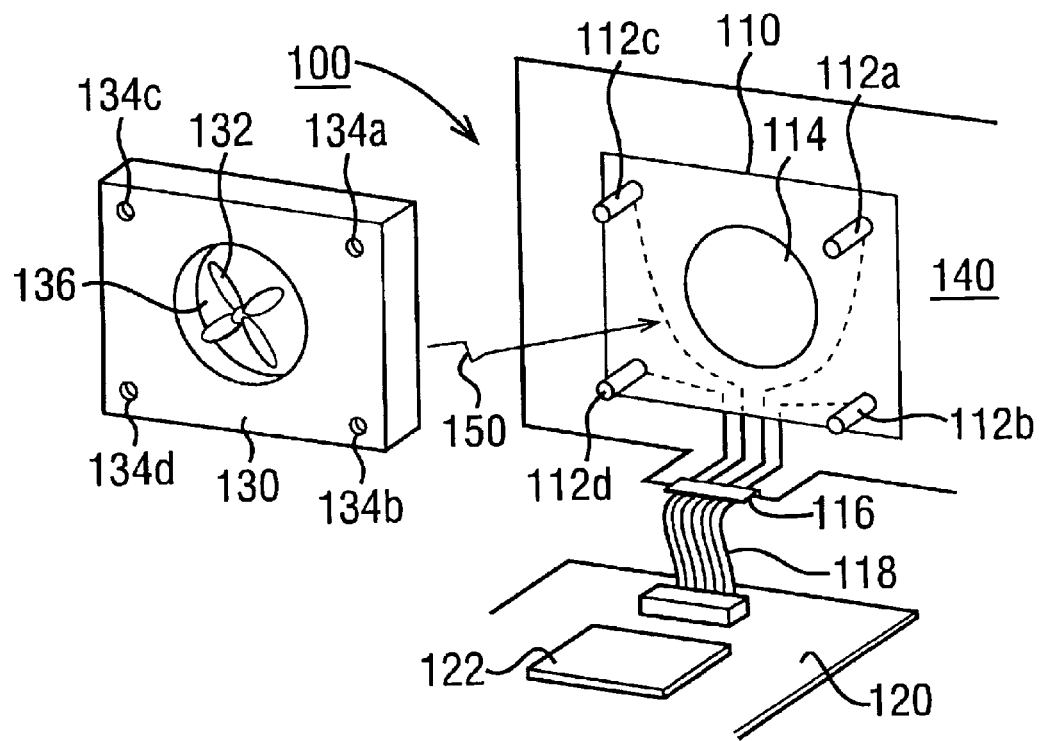
FIG. 3 shows a cooling unit assembly according to a third embodiment of the present invention.

FIG. 3 shows a cooling unit assembly 100 of a third embodiment of the present invention. The cooling unit assembly 100 comprises an electrically powered cooling unit 130 removably coupled to a support structure 110 by way of four connectors formed by respective mutually co-operating male members 112a–d and female members 134a–d.

The support structure 110 has an aperture 114 and is mounted adjacent to a corresponding aperture formed in a part of a computer casing 140. An example of such a computer casing 140 is shown schematically in FIG. 11. The support structure 110 contains wiring that electrically connects individual of the male members 112a–d to an edge connector 116. A ribbon cable 118 connects the edge connector 116 to a computer motherboard 120 that houses a processor 122. Alternatively, the edge connector 116 can be arranged to plug directly into a corresponding socket on the motherboard 120.

The motherboard 120 provides both power and two signal paths to the support structure 110. Electrical power is provided to the electrically powered cooling unit 130 through the male members 112a and 112c. Male member 112a is connected to the ground power supply potential of the motherboard 120, and male member 112c is connected to the positive power supply potential of the motherboard 120. Additionally, under the control of the processor 122, which can be the main system processor (e.g. a microprocessor) or a separate service processor (e.g. a microprocessor or a microcontroller), a feedback control loop is established that monitors and regulates the performance of the electrically powered cooling unit 130. Male member 112b is connected to a tachograph input (not shown) on the motherboard 120. The tachograph input allows the processor 122 to monitor the operating speed, and thus efficiency, of the electrically powered cooling unit 130. The male member 112d provides a control input to the electrically powered cooling unit 130 that allows the operating speed to be adjusted. By monitoring the tachograph input and providing an appropriate control signal, the processor 122 regulates the performance of the electrically powered cooling unit 130.

FIG. 4A shows the electrically powered cooling unit 130 forming part of the cooling unit assembly 100 of FIG. 3 in more detail. The electrically powered cooling unit 130 comprises a fan housing 138 having a fan opening 136 in which is mounted a fan 132. The fan 132 is supported by radial spoke-like supports 201a–d that are formed as part of the fan housing 138. The fan comprises fan blades 206a–d rotatably mounted to a fan motor 204. The fan motor 204 is operable to drive the fan blades 206a–d so as to force air to move through the fan opening 136 in one direction in a manner that is well-known. Electrical connections for providing power to drive the fan motor 204 are provided through the radial spoke-like supports 201a–d.

The fan housing 138 comprises a tachometer sensor for detecting the speed of rotation of the fan blades 206a–d. In this example, one of the fan blades is provided with a magnetic tip 208 and the tachometer sensor includes a tachometer detector coil 210 that produces an output voltage spike each time the magnetic tip 208 passes. The interval between a series of such spikes is used by the processor 122 to determine the actual rotational speed of the fan 132. Simple fan drive circuitry 202 is housed in the body of the fan housing 138. This fan drive circuitry 202 is described below in relation to FIG. 5.

The fan housing 138 also comprises four female members 134a–d, each of which forms a part of a connector for connecting the electrically powered cooling unit 130 to a support structure 110. Each of the female members 134a–d provides both physical (mechanical) support for, and an electrical connection to, the electrically powered cooling unit 130. When the electrically powered cooling unit 130 is mounted on or to a support structure 110, the female member 134a connects a ground potential, through internal wiring formed in the fan housing 138, to the fan motor 204 and the fan drive circuitry 202. The female member 134c connects the fan drive circuitry 202 to a positive power supply potential, and the female members 134b and 134d connect to a tachograph input and a control input, respectively.

FIG. 4B shows a sectional view taken along the line X—X of FIG. 4A. The female members 134a and 134b each comprise a resilient electrical contact formed by a respective resilient split ring connector 222. The split ring connectors 222 are mounted in respective annular recesses 137a, 137b. A shaped portion of split ring connectors 222 protrudes into the respective channel of the female members 134a and 134b in order that they bear onto any male members correctly fitted therein. A male/female connector 400 formed using such an arrangement is shown in more detail in FIG. 6, below.

Figure 5:
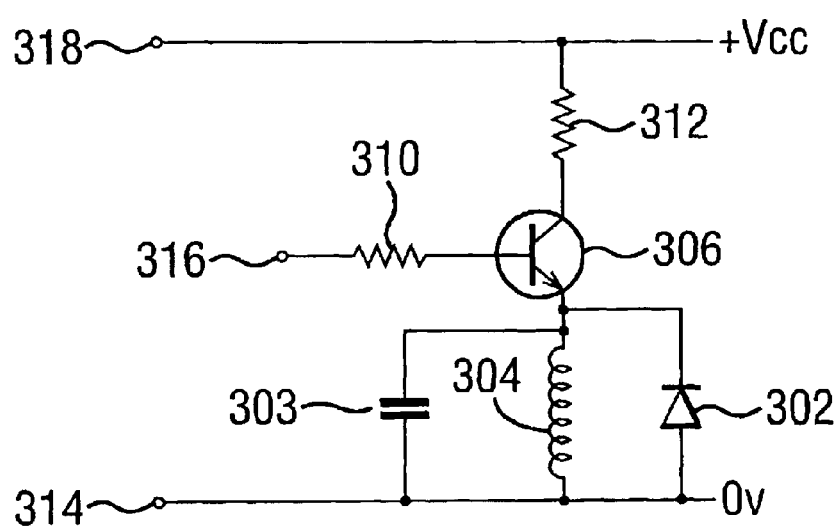
FIG. 5 shows fan drive circuitry forming part of the electrically powered cooling unit shown in FIG. 4.

FIG. 5 shows fan drive circuitry 202 that forms part of the electrically powered cooling unit 130. The fan drive circuitry 202 comprises a power transistor 306 the collector of which is connected to a typically 5, 12, 24 or 48 volt positive supply rail 318 by way of collector resistor 312. The positive supply rail 318 is connected to female member 134c. The base of the power transistor 306 is connected through base resistor 310 to speed input terminal 316. In turn, the speed input terminal 316 is connected to female member 134d. The emitter of the power transistor 306 is connected to the cathode of a reverse-biassed diode 302, a smoothing capacitor 303 (typically 47 $\mu$F), and to an output wire that couples the fan drive circuitry 202 to a first terminal of a fan motor drive coil 304 (forming part of the fan motor 204). The ground rail 314 is connected to the anode of the reverse-biassed diode 302 and externally to a second terminal of the fan motor drive coil 304.

In operation, a control signal applied to the speed input terminal 316 regulates the current that the power transistor 306 delivers to the fan motor drive coil 304, and thereby the speed of the fan motor 204. The values of the base resistor 310 and collector resistor 312 are selected so as to prevent the power transistor 306 from saturating should the control signal exceed a level of about 0.7 to 1 volt. The reverse-biassed diode 302 acts to reduce damage to the power transistor 306 that can be caused by any so-called back-EMF induced by the motor drive coil should the fan stop suddenly.

Figure 6:
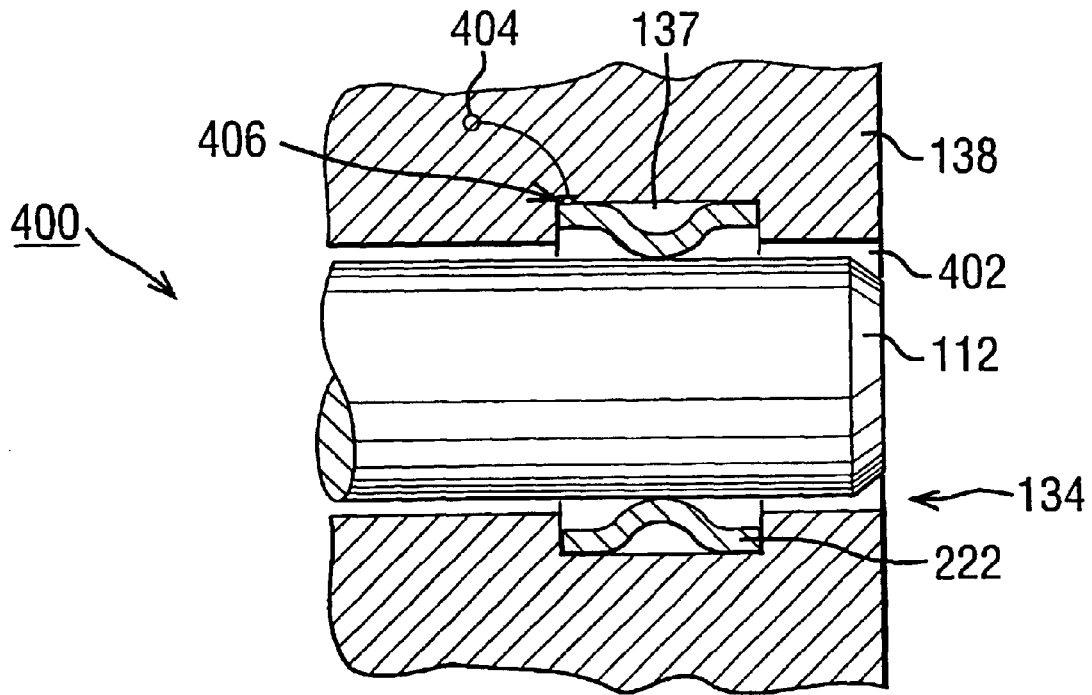
FIG. 6 shows the coupling arrangement of one connector for coupling the electrically powered cooling unit shown in FIG. 4 to the support structure shown in FIG. 3.

FIG. 6 shows a partial cross-section of one connector 400 used to couple the electrically powered cooling unit 130 (shown in FIG. 4) to the support structure 110 (shown in FIG. 3). The connector 400 comprises a male member 112 releaseably retained in a channel 402 of a female member 134. The male member 112 comprises a tapered tip to aid insertion into the corresponding female member 134. The female member 134 comprises a resilient electrical contact formed by an electrically conducting resilient split ring connector 222 mounted in an annular recess 137. The resilient split ring connector 222 has a diameter that is slightly larger than that of the annular recess 137. The resilient split ring connector 222 is inserted into the annular recess 137 by compressing the resilient split ring connector 222 so that it has a diameter less than that of the channel 402, sliding the compressed resilient split ring connector 222 into place and then releasing it so that it springs open into the annular recess 137. A conducting bump contact 406, having a diameter larger than the gap formed in the resilient split ring connector 222, protrudes into the annular recess 137. Additionally, a shaped portion of split ring connector 222 protrudes into the channel 402 of the female member 134 and bears onto the inserted male member 112. Insertion of the male member causes the split ring connector 222 to dilate and to bear onto the conducting bump contact 406 thereby providing a conducting path between the wiring 404 and the male member 112.

Figure 7A:
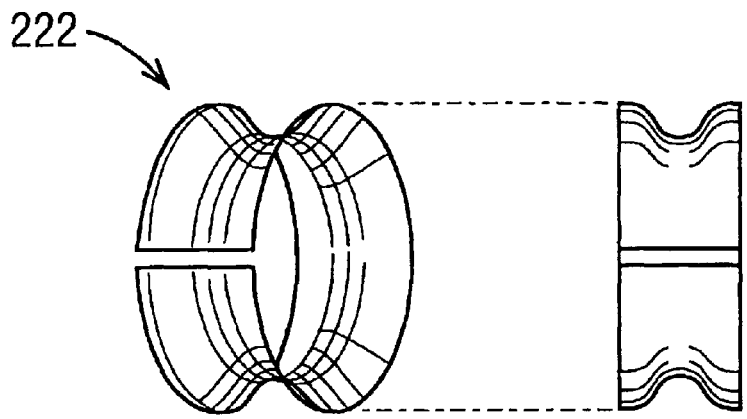
FIG. 7A shows a split-ring connector for use in the coupling of FIG. 7.

FIG. 7A shows the split ring connector 222 from both a perspective and a side view, respectively. A flat-surfaced metal ring is deformed at the midpoint of its thickness to form a circumferential indentation that projects towards the centre of the ring. The deformed metal ring is then cut to form a split ring connector 222.

Figure 7B:
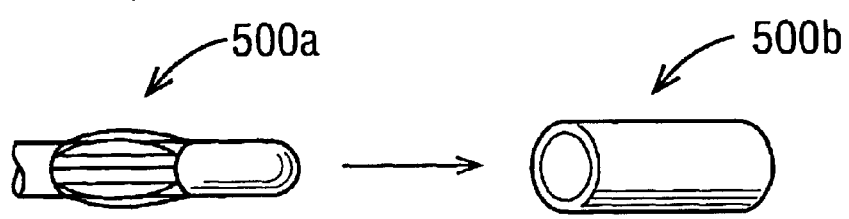
FIG. 7B shows another type of connector arrangement suitable for use in embodiments of the present invention.

FIG. 7B shows another type of connector arrangement 500 that can be used to mechanically and electrically connect a cooling unit to a support structure. The connector arrangement 500 comprises a female member 500b formed from a conducting cylindrical element. The first female member 500b can be formed as an integral part of a support structure or a cooling unit. The connector arrangement 500 also comprises a male member 500a that co-operates with the female member 500b to provide mechanical support and an electrical connection therebetween. The male member 500a is attached to either the cooling unit (where the female member 500b is formed in the support structure) or to the support structure unit (where the female member 500b is formed in the cooling unit). The male member 500a carries a resilient expanded metal sleeve that bears against the inside of the female member 500b and provides electrical contact therebetween.

Figure 7C:
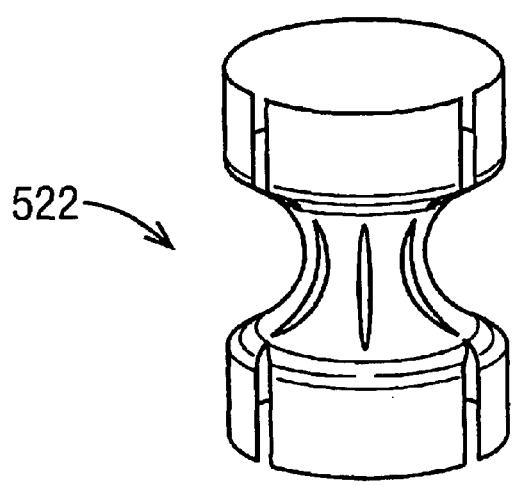
FIG. 7C shows a socket element suitable for incorporating into a connector arrangement for use in embodiments of the present invention.

FIG. 7C shows a socket element 522 that can be used to mechanically and electrically connect a cooling unit to a support structure. The socket element 522 comprises a hollow tubular hour-glass shaped resilient metal foil having longitudinal slots cut in the central waist portion to provide a resilient electrical contact onto a male rod-like member inserted therein. The upper and lower end portions of the socket element also comprise respective slots to allow the socket element 522 diameter to be compressed for insertion into a retaining annular groove formed in either the cooling unit or the support structure.

Figure 8:
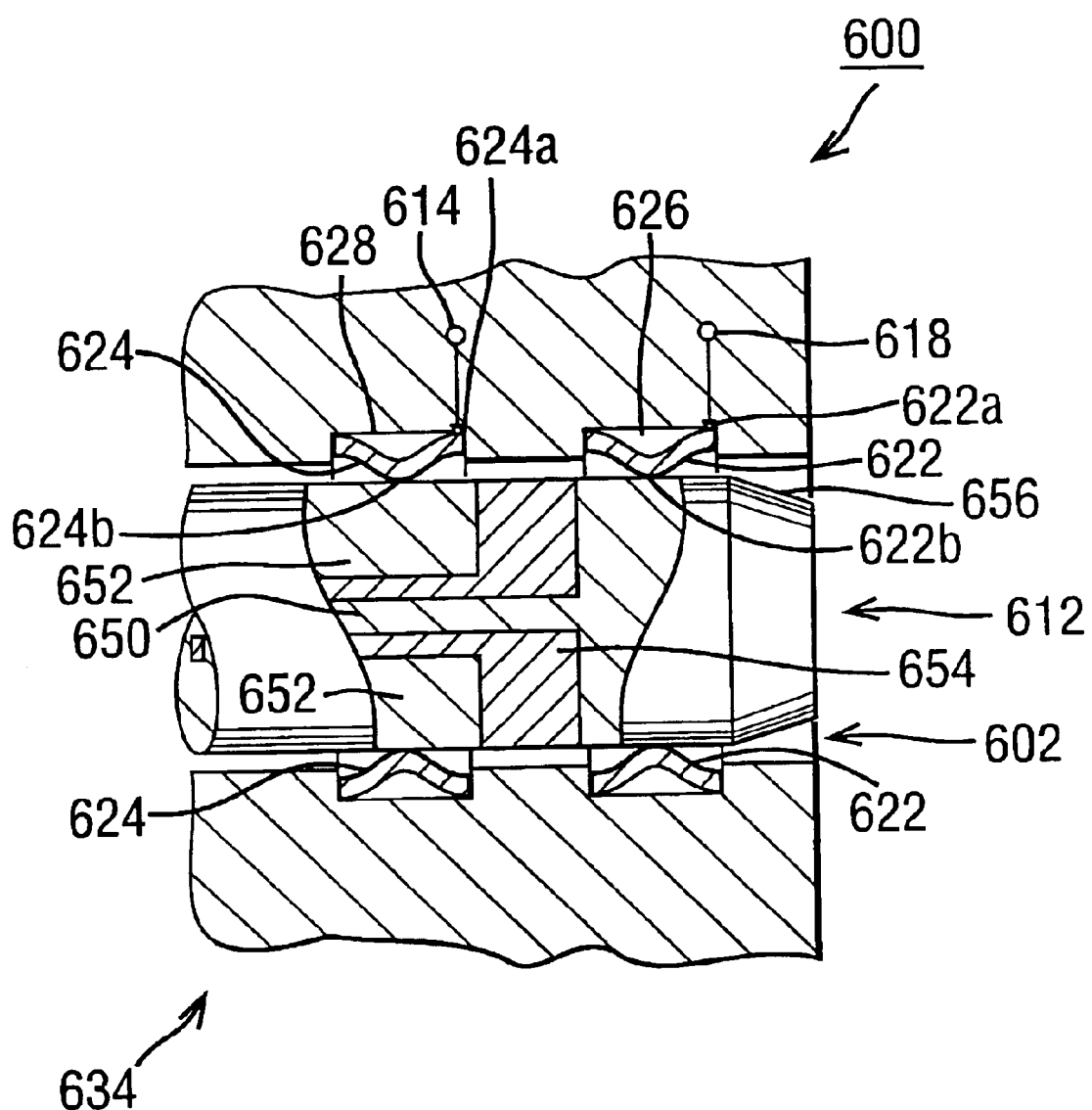
FIG. 8 shows a coupling according to another embodiment of the present invention.

FIG. 8 shows a connector 600 of another embodiment of the present invention. The connector 600 provides physical support for a male member 612 and two electrical connections between the male member 612 and the female member 634. The male member 612 comprises first and second shaped conductors 650 and 652 insulated from each other by an insulating insert 654. The first conductor 650 has a tapered end 656 to aid insertion into the female member 634.

The female member 634 comprises a channel 602 within which are mounted first and second resilient split ring connectors 622 and 624. The first connector 622 is mounted in an annular recess 626 in the channel 602. The second connector 624 is mounted in an annular recess 628 in the channel 602. Each resilient connector 622 and 624 is formed as a split ring or part-annular band. The resilient connectors 622, 624 are configured to have a diameter slightly larger than that of the corresponding annular recesses 626, 628. Each of the resilient connectors 622, 624 is inserted into a corresponding recess 626, 628 by compressing the split ring or part annular band forming the resilient connector so that its diameter is less than that of the channel 602, sliding them to the location of the corresponding annular recesses 626 and 628 and then releasing the split ring or part annular band so that the resilient connectors spring open into the recesses 626 and 628, respectively. In the rest position, the outside edges 622a, 624a of each resilient connector 622, 624 press against a respective electrical connection 614, 618 in the recesses 626, 628, respectively. The middle portion 622b, 624b of each of the resilient connectors is formed so as to bow inwards resiliently to make contact (as shown in FIG. 6), with a respective one of the conductors 650 and 652 of the male member 612 when inserted in the channel 602.

When the male member 612 is fully inserted into the channel 602, an electrical contact is formed between the first conductor 650 and the electrical connection 618 via the first resilient connector 622. Similarly, an electrical contact is formed between the second conductor 652 and the electrical connection 614 via the second resilient connector 624.

Figure 9A:
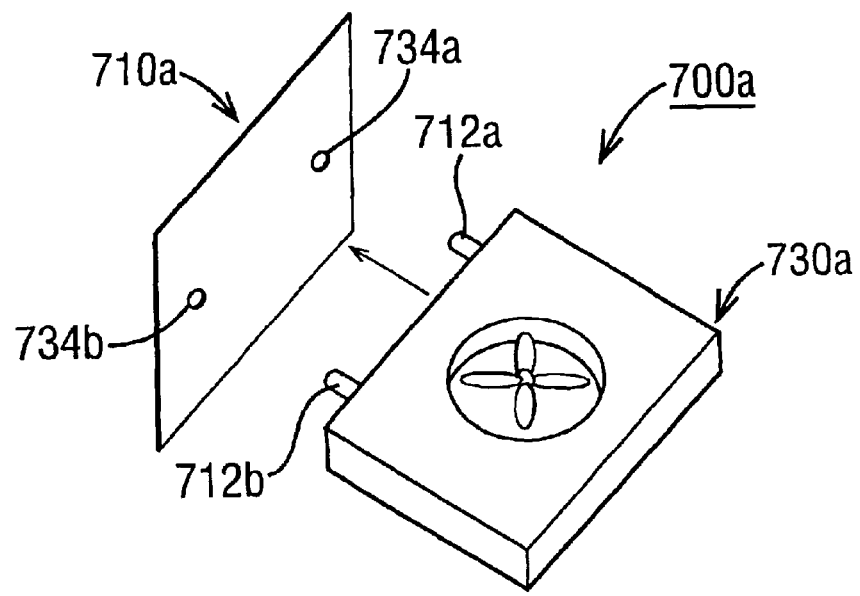
FIG. 9A shows a cooling unit assembly according to a further embodiment of the present invention.

FIG. 9A shows a cooling unit assembly 700a according to an embodiment of the present invention. The cooling unit assembly 700a comprises a support structure 710a having two female members to which can be coupled an electrically powered cooling unit 730a. The electrically powered cooling unit 730a is shown mounted in a horizontal orientation. The electrically powered cooling unit 730a has two male members 712a, 712b that co-operate with the two female members 734a, 734b of the support structure 710a to form connectors that provide both electrical connections and support for the electrically powered cooling unit 730a.

Figure 9B:
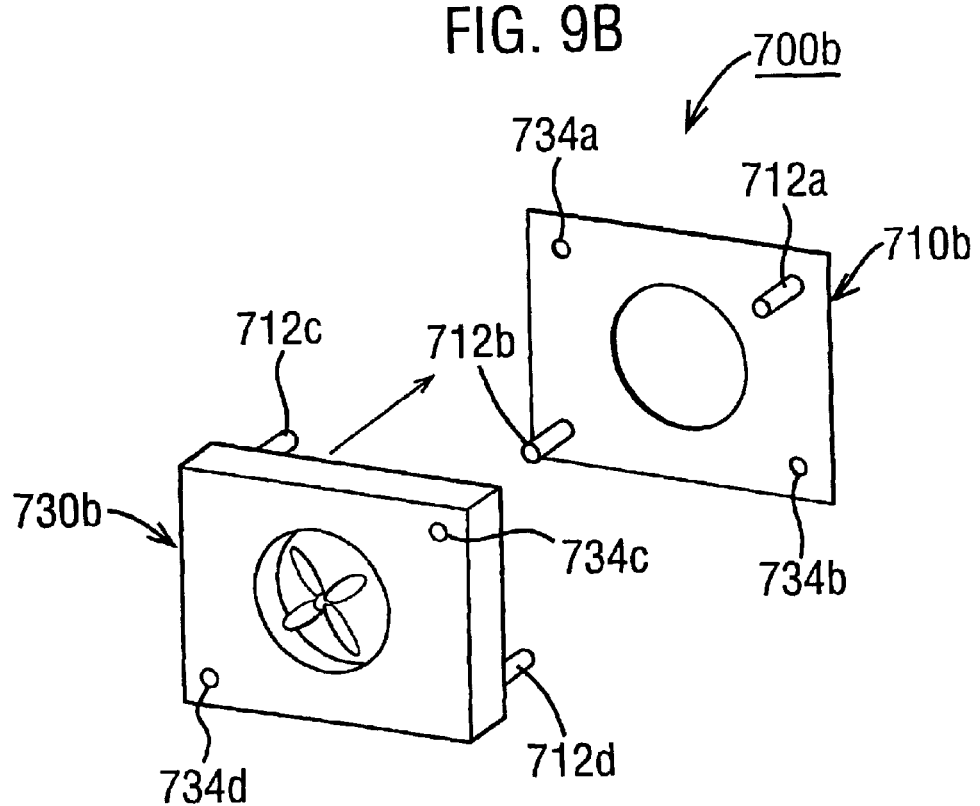
FIG. 9B shows a cooling unit assembly according to another embodiment of the present invention.

FIG. 9B shows a cooling unit assembly 700b of an embodiment of the present invention. The cooling unit assembly 700b comprises a support structure 710b having two female members 734a, 734b and two male members 712a, 712b to which can be coupled to an electrically powered cooling unit 730b. The electrically powered cooling unit 730b has two male members 712c, 712d and two female members 734c, 734d that co-operate with respective ones of the two female members 734a, 734b and the two male members 712a, 712b of the support structure 710b to form connectors that provide both electrical connections and mechanical support for the electrically powered cooling unit 730b.

Figure 9C:
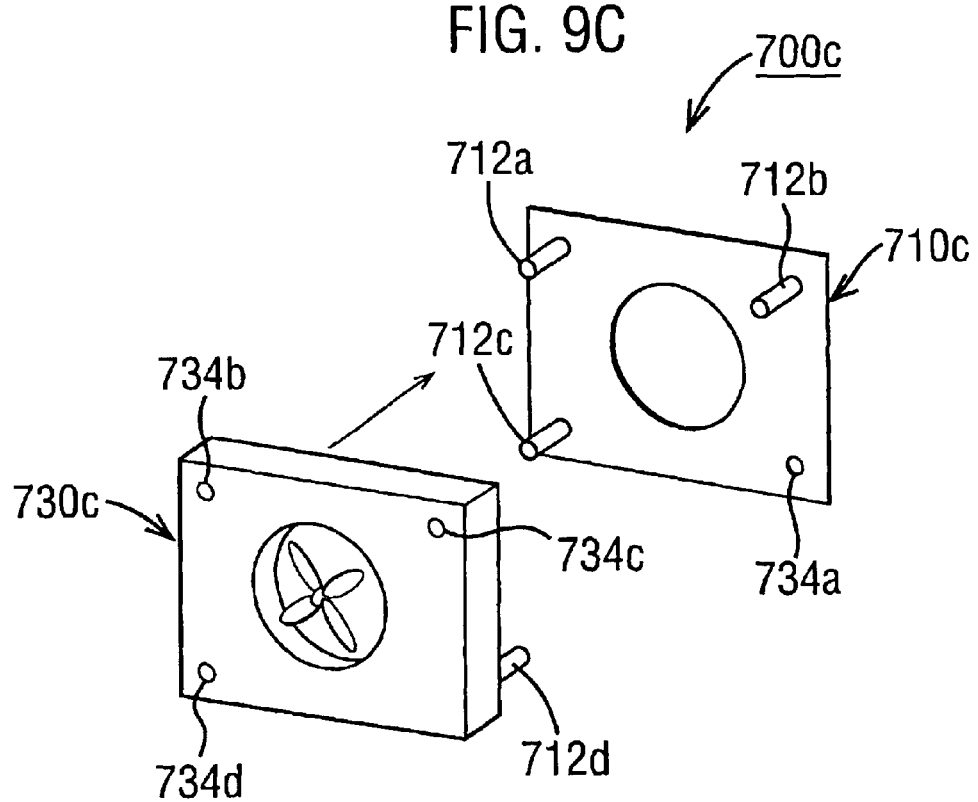
FIG. 9C shows a cooling unit assembly according to a further embodiment of the present invention.

FIG. 9C shows a cooling unit assembly 700c of an embodiment of the present invention. The cooling unit assembly 700c comprises a support structure 710c having one female member 734a and three male members 712a–c to which can be coupled an electrically powered cooling unit 730c. The electrically powered cooling unit 730c has one male member 712d and three female members 734b–d that co-operate with respective ones of the one female member 734a and the three male members 712a–c of the support structure 710c to form connectors that provide both electrical connections and mechanical support for the electrically powered cooling unit 730c. The cooling unit assembly 700c is advantageous in that it helps prevent the electrically powered cooling unit 730c from being incorrectly connected to the support structure 710c.

Figure 9D:
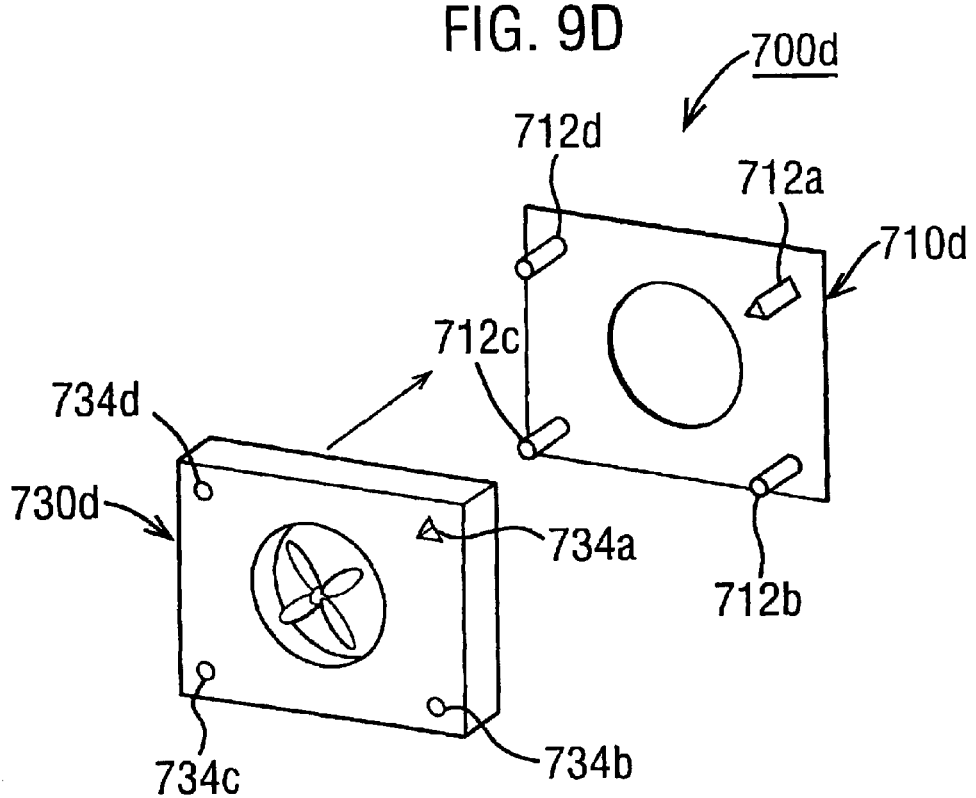
FIG. 9D shows a cooling unit assembly according to another embodiment of the present invention.

FIG. 9D shows a cooling unit assembly 700d of an embodiment of the present invention. The cooling unit assembly 700d comprises a support structure 710d having four male members 712 to which can be coupled an electrically powered cooling unit 730d. One of the male members 712a is differently shaped in cross-section from the other three male members 712b–d, in this case three members 712b–d are of substantially circular cross-section and the fourth 712a is of substantially triangular cross-section. The electrically powered cooling unit 730d has four female members 734 of correspondingly shaped channel cross-section that co-operate with respective ones of the four male members 712 of the support structure 710d to form connectors that provide both electrical connections and mechanical support for the electrically powered cooling unit 730d. The cooling unit assembly 700d is also advantageous in that it helps prevent the electrically powered cooling unit 730d from being incorrectly connected to the support structure 710d.

Figure 9E:
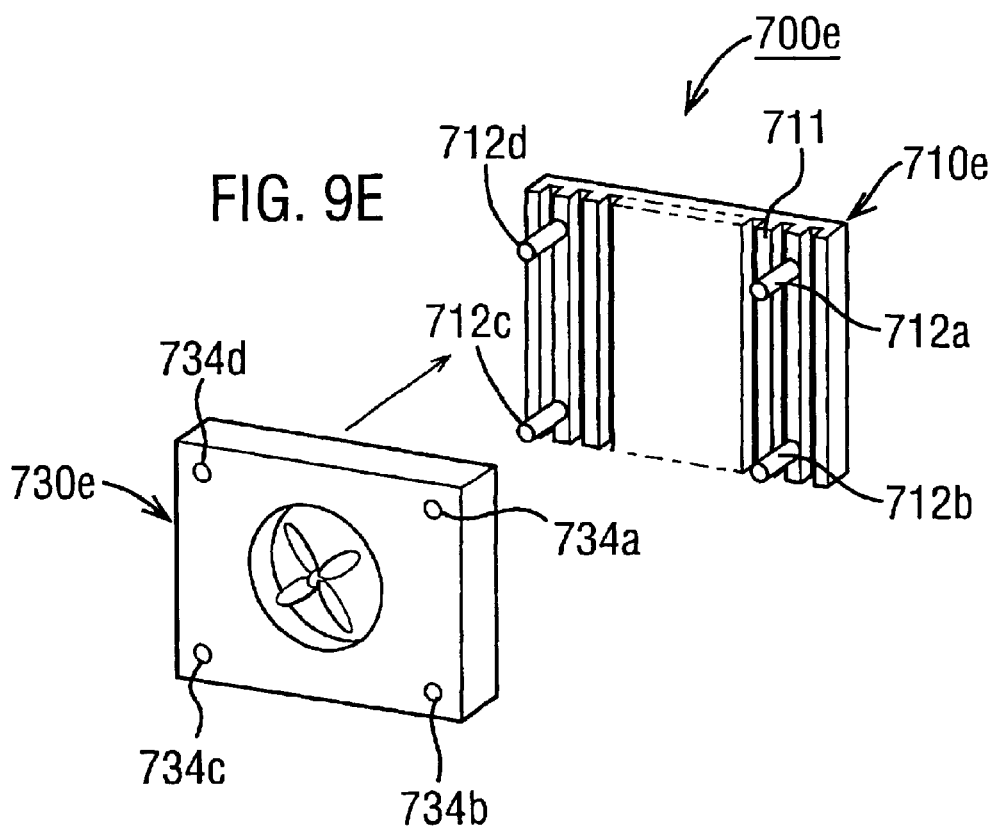
FIG. 9E shows a cooling unit assembly according to yet another embodiment of the present invention.

FIG. 9E shows a cooling unit assembly 700e of another embodiment of the present invention. The cooling unit assembly 700e comprises a support structure 710e having four male members 712a–d to which can be coupled an electrically powered cooling unit 730e. The support structure 710e is formed as a finned heatsink including fins 711. The electrically powered cooling unit 730e has four female members 734a–d that co-operate with respective ones of the four male members 712a–d of the support structure 710e to form connectors that provide both electrical connections and support for the electrically powered cooling unit 730e. In this embodiment, the fins have air drawn or blown over them by the electrically powered cooling unit 730e, to extract heat from either a casing environment or electronic circuitry, such as processing circuitry, mounted, to which the heatsink 710e is proximal to the electrically powered cooling unit 730e.

Figure 9F:
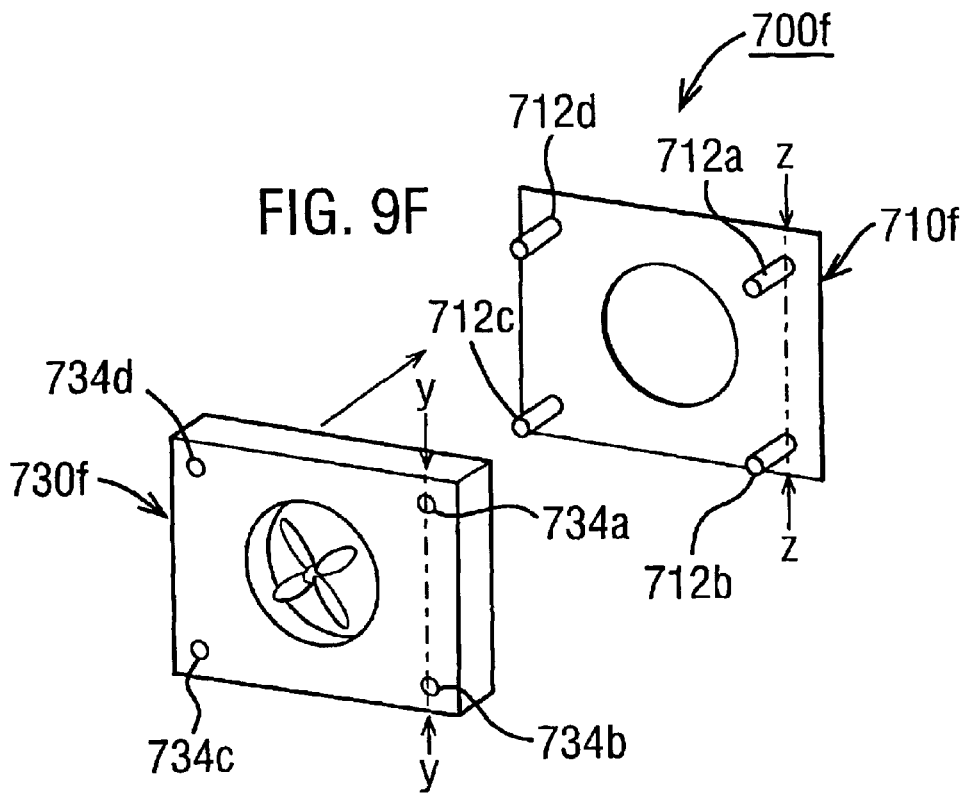
FIG. 9F shows a cooling unit assembly according to a further embodiment of the present invention.

FIG. 9F shows a cooling unit assembly 700f of another embodiment of the present invention. The cooling unit assembly 700f comprises a support structure 710f having four male members 712a–d to which can be coupled an electrically powered cooling unit 730f. The electrically powered cooling unit 730f has four female members 734a–d of correspondingly shaped channel cross-section that receive and co-operate with respective ones of the four male members 712a–d of the support structure 710f to form connectors that provide both electrical connections and support for the electrically powered cooling unit 730f. Conducting portions on the male members 712a–d are formed at different relative positions along their respective lengths.

FIG. 9G shows a sectional view along the line Y—Y of the electrically powered cooling unit 730f of FIG. 9F and a sectional view along the line Z—Z of the support structure 710f of FIG. 9F. The electrically powered cooling unit 730f has first and second resiliently biassed contacts 722a, 722b formed at different relative depth positions in respective ones of the female members 734a, 734b.

Co-operating male members 712a, 712b are formed on the support structure 710f. A first male member 712a has a conductive portion 713a formed towards its tip. The conductive portion 713a connects through an insulating portion 713a' to the support structure 710f. When the electrically powered cooling unit 730f is fully engaged with the support structure 710f, the conductive portion 713a of the first male member 712a engages with the first resiliently biassed contact 722a and provides an electrical connection. A second male member 712b has a conductive portion 713b formed towards its centre. The tip and base of the second male member 712b are formed using an insulating portion 713b' through which the conductive portion 713b connects to the support structure 710f. When the electrically powered cooling unit 730f is fully engaged with the support structure 710f, the conductive portion 713b of the second male member 712b engages with the second resiliently biassed contact 722b and provides an electrical connection.

Should the cooling unit 730f be attached to the support structure so that the first male member 712a engages with the second female member 734b, the second resiliently biassed contact 722b does not engage the conductive portion 713a at the same time as the first resiliently biassed contact 722a engages the conductive portion 713b. This depth-keying technique helps avoid an electrical circuit being made that can damage the cooling unit and/or other electrical/electronic circuitry.

From the above examples, it can be seen that keying can be employed to help prevent the electrically powered cooling unit(s) from being mis-connected to the support structure. This helps reduce the possibility of physical and electrical damage occurring to the electrically powered cooling unit(s). To provide keying at least one male/female combination can be employed that has a differently shaped cross-section from at least one other male/female combination. Alternatively, or in addition, where a plurality of connectors is employed, a geometric arrangement of connector positions can be used to ensure that the electrically powered cooling unit is connectable to the support structure only when oriented in a unique predetermined orientation. Alternatively, or in addition, depth-keying can be employed, for example by providing a plurality of connectors having at least one male member of a different length compared to at least one other male member. Electrical contact between the male members and their respective co-operating female members can be made at different relative positions along the lengths of at least two of the plurality of connectors. Another way of providing depth-keying is to employ a plurality of connectors having at least two male members of the same length but with electrically conducting portions formed at different relative positions. For example, such an arrangement can be obtained by the use of a male member having a conductive portion formed at the same relative position as an insulating portion of a further male member.

As mentioned above, the connector and co-operating connector formations linking the electrically powered cooling unit (or units) to the support structure (or structures) can be formed by at least one inter-engaging male and female member pair. Any number of such male/female member pairs can be used, and the individual male/female members of each pair can be formed on either the electrically powered cooling unit(s) or the support structure(s). The same or different gender-type members can be formed on the electrically powered cooling unit(s) or the support structure(s) where a plurality of male/female pairs is employed. The connector and co-operating connector formations can provide electrical connection(s) and/or physical connection(s) between the electrically powered cooling unit(s) and the support structure(s). Resiliently biassed contacts can be used as part of connector assemblies. Such resiliently biassed contacts can be used to provide one or more electrical connections between a support structure and a cooling unit.

Figure 10:
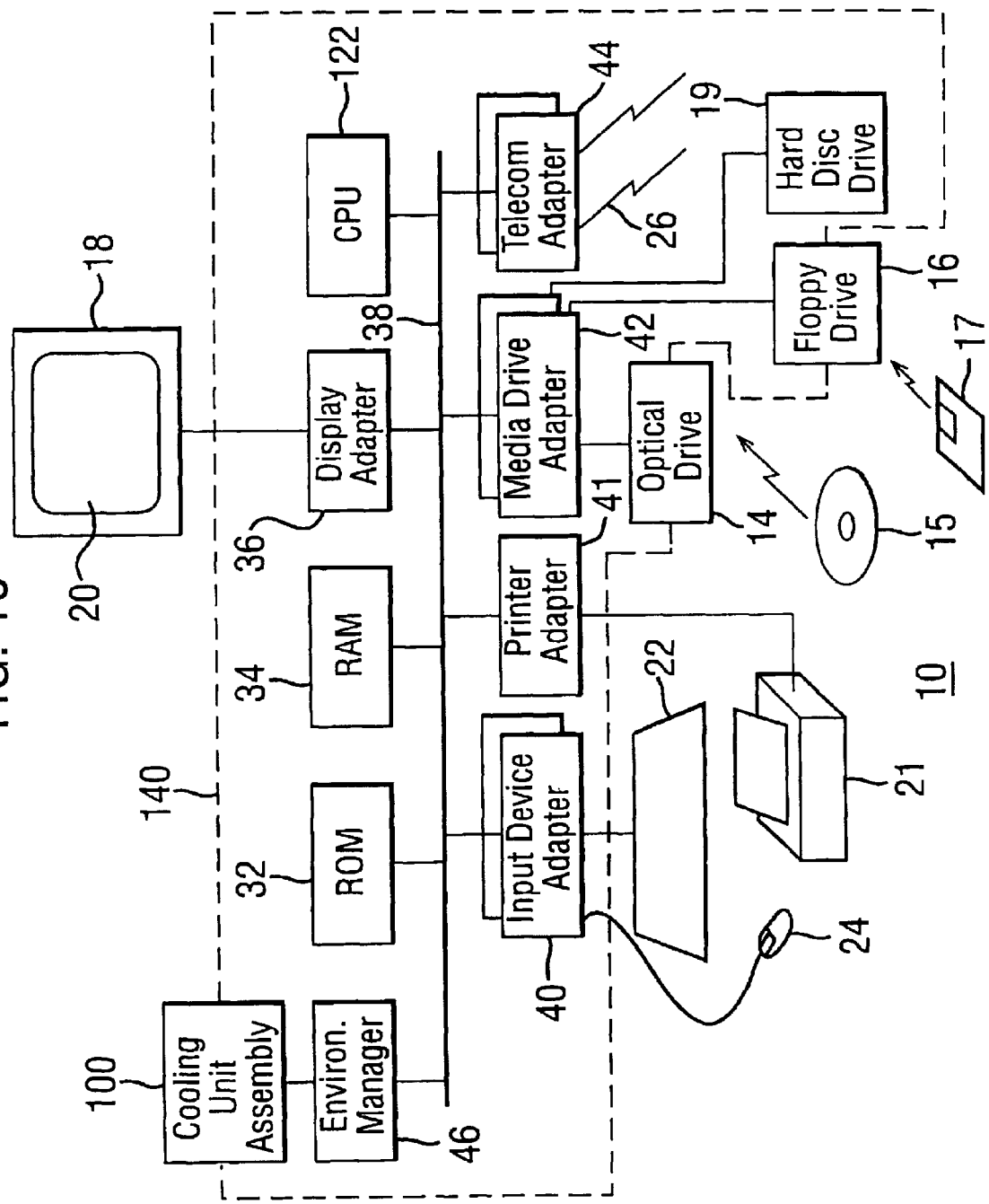
FIG. 10 shows a computer system which can be housed in a casing in which the cooling unit assembly according to the present invention can be deployed.

Referring now to FIG. 10, there is shown a schematic and simplified representation of an illustrative implementation of a data processing apparatus in the form of a computer system 10. As shown in FIG. 10, the computer system comprises various data processing resources such a processor (CPU) 122 coupled to a bus structure 38. Further data processing resources are also connected to the bus structure 38, such as read only memory 32 and random access memory 34. A display adaptor 36 connects a display device 18 to the bus structure 38. Also connected to the bus is an environment manager 46 that controls a cooling unit assembly 100 that provides cooling for the computer housing 140.

The environment manager 46 monitors the internal temperature of the housing 140 using a thermocouple temperature sensor and adjusts the control input of the cooling units in the cooling unit assembly 100 depending upon the measured internal temperature. The environment manager 46 also monitors the tachograph outputs of each of the cooling units in the cooling unit assembly 100. Should the internal temperature rise beyond a predetermined limit, or should one or more of the tachograph outputs of the cooling units drop below a certain speed into a predetermined operating range, the environment manager 46 can assert a non-maskable interrupt signal on the bus structure 38. The processor 122 deals with the non-maskable interrupt by suspending current processing and calling an interrupt routine from the ROM 32. The interrupt routine causes a message to be presented on the display device 18 indicating the nature of the problem, causes the shut down of as many non-essential software and hardware tasks as possible, and instructs the processor 122 to minimise its clock rate.

The environment manager 46 also monitors cooling unit presence by testing whether the control input of the cooling units is drawing any current. If no current is being drawn and the computer system is operating in a safe temperature zone, the environment manager 46 asserts a maskable interrupt on the bus structure 38 to indicate to the processor 122 that a hot-swap of a cooling unit is being performed. Operating system software operated by the processor 122 notes the maskable interrupt and deals with it as a conventional hot-swap event.

Figure 11:
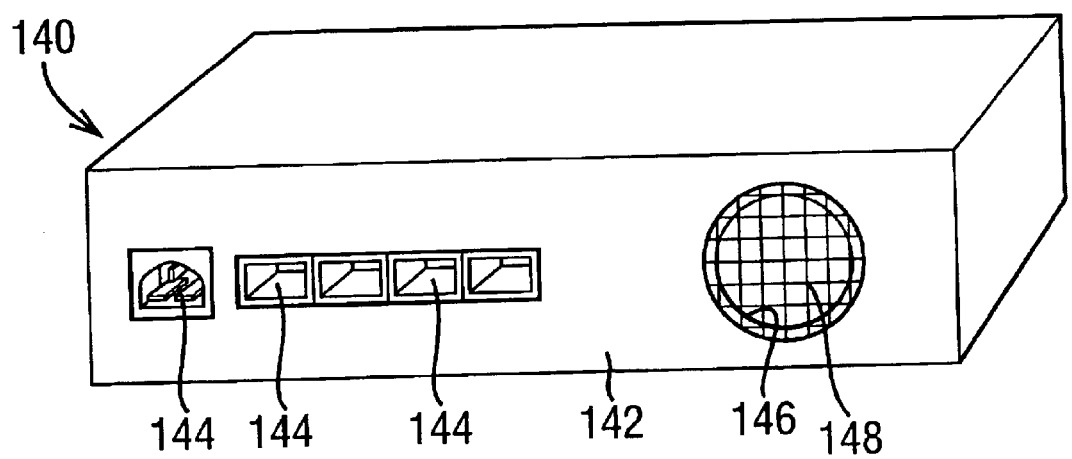
FIG. 11 is a schematic perspective representation from the rear of the casing of the computer of FIG. 10.

FIG. 11 is a schematic perspective view, from the rear, of the casing 140 of the computer of FIG. 10. Various conventional connectors 144 for power, Ethernet, etc. are provided on the rear wall 142 of the casing 140. Also visible is an aperture 146 that is arranged to align with aperture 114 in the support structure 110 so that waste heat is expelled from the computer casing 140 during operation of the electrically powered cooling unit. It will be noted that the aperture in the wall in the casing is covered by a grill 148 to reduce the risk of entry of objects into the casing and the cooling units and to provide electromagnetic and fire screening. Rather than one opening in combination with a grill, a plurality of smaller openings, possibly also in combination with a grill, could also be used to help reduce the likelihood of objects entering the casing and the cooling unit(s).

Figure 12:
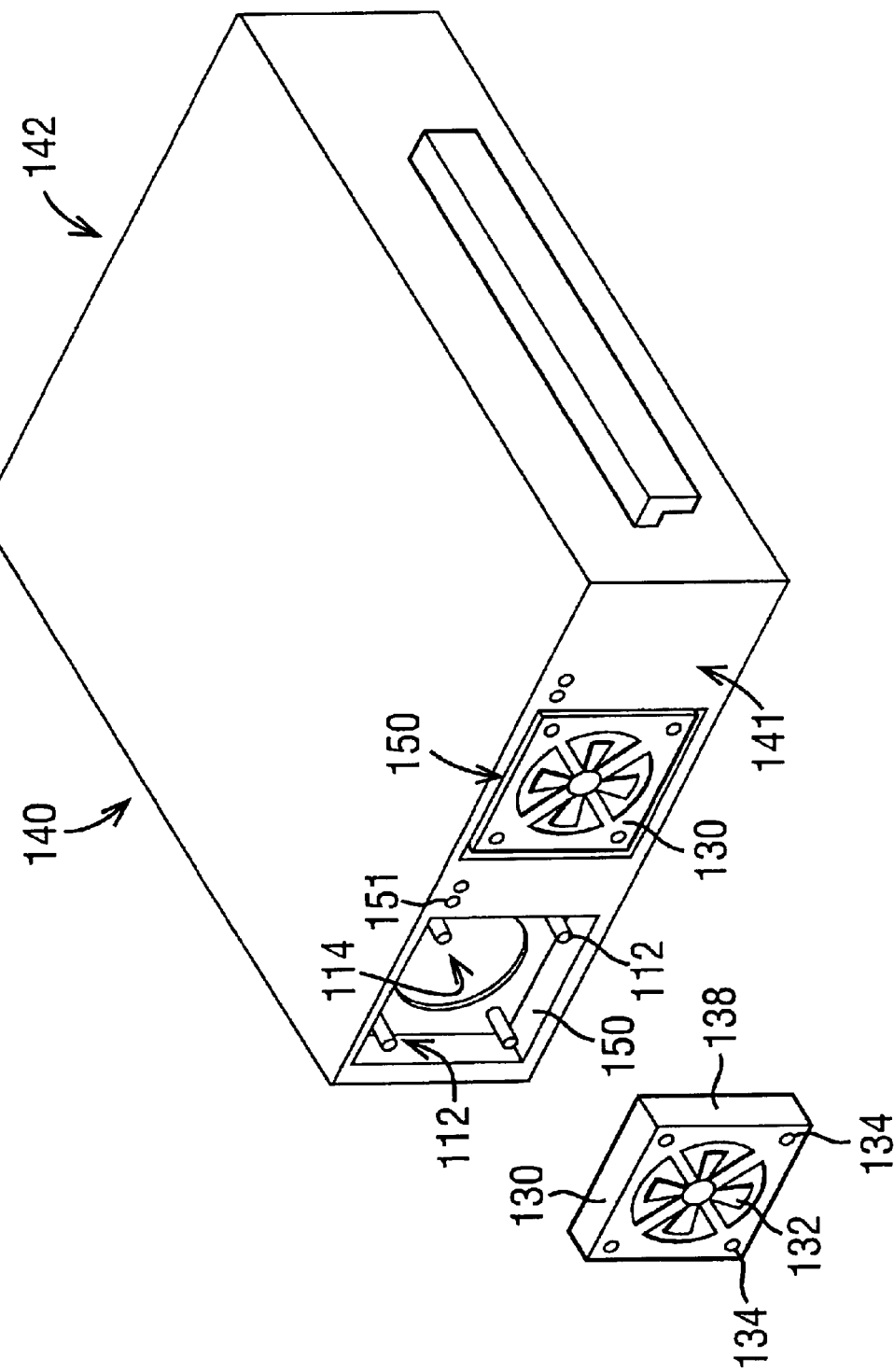
FIG. 12 is a schematic perspective view of a further mounting arrangement of the cooling unit.

FIG. 12 is a perspective view of an electronic circuit module housing 140 to which cooling units are mountable externally. The casing 140 has two recesses 150 formed in its front face 141. The recesses 150 could alternatively or additionally be formed in the rear face 142 of the casing 140.

The recesses 150 are generally square in outline, and at each corner a male member 112 is positioned so as to provide physical support and electrical connection to a cooling unit 130. The cooling unit 130 comprises a housing 138 and a fan 132. The housing 138 is shaped so as closely to fit within the recess 150 and has at its corners female members 134 to co-operate with the male members 112 in the recess 150.

As was previously described in relation to FIGS. 3 and 4, the male members 112 within the recess 150 provide electrical power to the cooling unit 130 and may also provide signalling inputs and outputs to sense and/or control the speed of the fan 132. The front face 141 of the casing 140 may be provided with indicator lights 151 to give a visual indication of the operational status of the cooling units 130.

The cooling unit 130 is mounted to the casing 140 by offering the cooling unit 130 up to the recess 150 and inserting it therein, so that the male members 112 each enter a respective female member 134 of the cooling unit 130. Air drawn through the fan housing 138 by the fan 132 is delivered to the interior of the casing 140 by an opening 114 in the base of the recess 150.

Indicator lights 151 connected to the circuitry within the casing 140 may provide an indication that their associated cooling unit 130 is successfully operating and/or the cooling unit has failed. When a failed cooling unit is sensed by the circuitry, and the visual indication of failure has been given, an operator can remove the faulty cooling unit 130 from its recess 150, and replace it with a serviceable unit. By mounting the cooling units 130 externally to the casing 140, the casing 140 may remain in the rack and in operation while the cooling units 130 are replaced.

If it is desired to prevent removal of the cooling units 130 by unauthorised personnel, the cooling units may, as is shown in FIG. 3, be mounted internally of the casing 140 so that the casing must be opened in order to replace the cooling unit.

There has been described an electrically powered cooling unit, such as a fan unit, that is mountable on a support structure within a housing, for example a computer housing. The support structure can mount one or more electrically powered cooling units.

The cooling units are mountable in a single operation in which mechanical and electrical connections are made together. Each cooling unit may include mechanical mounting elements and separate electrical contact elements at a fixed location relative to the cooling unit, so that locating the cooling unit in its mounting position makes the electrical contacts and aligns the mechanical connectors for operation. Alternatively, each cooling unit may include at least one connector that is used both to physically support and electrically connect the cooling unit to the support structure, thereby simplifying and making more reliable the mounting and dismounting of the cooling unit.

Although the invention has been described in relation to the preceding embodiments, by way of example only, it will be understood by those skilled in the art that the invention is not limited thereto, and that many variations are possible falling within the scope of the claimed invention. For example, any suitable number and/or type of connector assembly can be used to couple electrically powered cooling units to support structures. For example, bearing connectors can be used. As a further example, standard connectors such as jack plugs and sockets can also be incorporated, thereby reducing manufacturing costs. Furthermore, the support structures can be formed integrally with casings, and cooling unit assemblies of the present invention are not limited to use in computer equipment. Additionally, those skilled in the art will be aware that many electrically powered cooling units can be mounted on a single support structure.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during the prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An apparatus, comprising:
  a cooling unit, comprising:
    a fan housing;
    a fan coupled to the fan housing;
  a support structure, comprising:
    a support structure housing; and
    a first aperture in the support structure housing;
  at least two male members and at least two female members configured to cooperatively couple the cooling unit and the support structure;
  a computer casing comprising a second aperture, wherein at least a portion of the first aperture substantially aligns with at least a portion of the second aperture to allow air to pass through the first aperture and the second aperture when the support structure is coupled to the computer casing;
  wherein the at least two male members and the at least two female members are configured to both guide the cooling unit onto the support structure in substantially one operable orientation and provide electrical connections to the cooling unit.

2. The apparatus of claim 1, wherein the at least two male members comprise:
  a first male member, wherein a ground power supply is provided to the cooling unit through the first male member;
  a second male member, wherein a positive power supply is provided to the cooling unit through the second male member; and
  a third male member, wherein a control signal is provided to the cooling unit through the third male member.

3. The apparatus of claim 1, wherein the at least two male members and at least two female members are situated near a perimeter of the cooling unit housing and support structure housing.

4. The apparatus of claim 1, wherein at least one female member of the at least two female members comprises a resilient electrical contact.

5. The apparatus of claim 4, wherein the resilient electrical contact comprises a resilient split ring connector mounted in an annular recess of the female member.

6. The apparatus of claim 1, wherein the support structure further comprises:
an edge connector; and
wiring to electrically couple a male member of the at least two male members or a female member of the at least two female members to the edge connector, wherein the wiring is contained in the support structure.

7. The apparatus of claim 1, wherein the fan housing further comprises:
a motor coupled to the fan; and
at least two radial spoke supports formed in the fan housing to couple the motor to the fan housing, wherein at least one radial spoke support further provides electrical connections to the motor.

8. The apparatus of claim 1, wherein the fan housing is attached to the support structure solely by the at least two male members and corresponding ones of the at least two female members.

9. The apparatus of claim 1, wherein at least one of the at least two male members is shaped so as to be cooperable with a female member of the at least two female members only in a single relative orientation of the cooling unit and supporting structure.

10. An apparatus, comprising:
a cooling unit, comprising:
a fan housing;
a fan coupled to the fan housing; and
at least three male members connected to the fan housing;
a support structure, comprising:
a support structure housing;
a first aperture in the support structure housing; and
at least three female members in the support structure housing;
a computer casing comprising a second aperture, wherein at least a portion of the first aperture substantially aligns with at least a portion of the second aperture to allow air to pass through the first aperture and the second aperture when the support structure is coupled to the computer casing;
wherein the at least three male members and the at least three female members are configured to both guide the cooling unit onto the support structure in substantially one operable orientation and provide electrical connections to the cooling unit.

11. The apparatus of claim 10, wherein the at least three male members comprise:
a first male member, wherein a ground power supply is provided to the cooling unit through the first male member;
a second male member, wherein a positive power supply is provided to the cooling unit through the second male member; and
a third male member, wherein a control signal is provided to the cooling unit through the third male member.

12. The apparatus of claim 10, wherein at least one female member of the at least three female members comprises a resilient electrical contact.

13. The apparatus of claim 12, wherein the resilient electrical contact comprises a resilient split ring connector mounted in an annular recess of the female member.

14. The apparatus of claim 10, wherein the support structure further comprises:
an edge connector; and
wiring to electrically couple a male member of the at least three male members or a female member of the at least three female members to the edge connector, wherein the wiring is contained in the support structure.

15. The apparatus of claim 10, wherein the fan housing further comprises:
a motor coupled to the fan; and
at least two radial spoke supports formed in the fan housing to couple the motor to the fan housing, wherein at least one radial spoke support further provides electrical connections to the motor.

16. An apparatus, comprising:
a cooling unit, comprising:
a fan housing;
a fan coupled to the fan housing; and
at least three female members in the fan housing;
a support structure, comprising:
a support structure housing;
a first aperture in the support structure housing; and
at least three male members connected to the support structure housing;
a computer casing comprising a second aperture, wherein at least a portion of the first aperture substantially aligns with at least a portion of the second aperture to allow air to pass through the first aperture and the second aperture when the support structure is coupled to the computer casing;
wherein the at least three male members and the at least three female members are configured to both guide the cooling unit onto the support structure in substantially one operable orientation and provide electrical connections to the cooling unit.

17. The apparatus of claim 16, wherein the at least three male members comprise:
a first male member, wherein a ground power supply is provided to the cooling unit through the first male member;
a second male member, wherein a positive power supply is provided to the cooling unit through the second male member; and
a third male member, wherein a control signal is provided to the cooling unit through the third male member.

18. The apparatus of claim 16, wherein at least one female member of the at least three female members comprises a resilient electrical contact.

19. The apparatus of claim 18, wherein the reailient electrial contact comprises a resilient split ring connector mounted in an annular recess of the female member.

20. The apparatus of claim 16, wherein the support structure further comprises:
an edge connector; and
wiring to electrically couple a male member of the at least three male members or a female member of the at least three female members to the edge connector, wherein the wiring is contained in the support structure.

21. The apparatus of claim 16, wherein the fan housing further comprises:
a motor coupled to the fan; and
at least two radial spoke supports formed in the fan housing to couple the motor to the fan housing, wherein at least one radial spoke support further provides electrical connections to the motor.

* * * * *